United States Patent [19]

Sacchi et al.

[11] Patent Number: 5,081,708
[45] Date of Patent: Jan. 14, 1992

[54] INTEGRATED CIRCUIT FOR GENERATING A TEMPERATURE INDEPENDENT, DYNAMICALLY COMPRESSED VOLTAGE FUNCTION OF THE VALUE OF AN EXTERNAL REGULATION RESISTANCE

[75] Inventors: Fabrizio Sacchi, Gambarana; Maurizio Zuffada; Giorgio Betti, both of Milan; Silvano Gornati, Casorezzo, all of Italy

[73] Assignee: SGS-Thomson Microelectronics, s.r.l., Italy

[21] Appl. No.: 492,741

[22] Filed: Mar. 13, 1990

[30] Foreign Application Priority Data

Mar. 13, 1989 [IT] Italy ............... 83612 A/89

[51] Int. Cl.[5] ............ H04B 1/06; H03F 3/45; H03K 5/153
[52] U.S. Cl. .................... 455/234; 330/256; 307/358
[58] Field of Search ........... 455/234, 239, 240; 307/264, 553, 562, 491, 493, 358; 330/284, 254, 256, 287, 289; 333/14

[56] References Cited

U.S. PATENT DOCUMENTS

| | | | |
|---|---|---|---|
| 3,737,774 | 6/1973 | Verhagen | 455/234 |
| 4,321,488 | 3/1982 | Srivastava | 307/358 |
| 4,339,728 | 7/1982 | Monticelli | 455/234 |
| 4,424,461 | 1/1984 | Taguchi et al. | 330/256 |
| 4,724,337 | 2/1988 | Maeda et al. | 330/256 |

Primary Examiner—Curtis Kuntz
Assistant Examiner—Andrew Faile
Attorney, Agent, or Firm—Pollock, Vande Sande & Priddy

[57] ABSTRACT

A temperature independent, dynamically compressed, DC control voltage is obtained by converting by means of a converter circuit employing a current mirror, a linear variation of the voltage across a control potentiometer, external to the integrated circuit, in a logarithmic differential voltage between two output voltage terminals, respectively on a first and a second branch of the converter circuit, the voltage signal taken from the first branch of the converter circuit being fed to the input of a unitary gain stage biased by a current generator with a temperature coefficient corresponding to the reciprocal of the temperature coefficient of integrated resistances and the corresponding output signal of the unitary gain stage being fed to a first input of a differential stage, to the second input of which is fed the signal taken from the second branch of the converter circuit. The differential stage being also biased by a current generator with a temperature coefficient equal to the reciprocal of the temperature coefficient of integrated resistances and having an integrated load resistance connected between the supply rail and the output terminal of the differential stage on which the desired temperature independent and dynamically compressed control voltage is produced. The circuit is particularly useful for generating a gain control current in an AGC system.

7 Claims, 2 Drawing Sheets $$I_o = \frac{V_o}{R_b}$$

INTEGRATED CIRCUIT FOR GENERATING A TEMPERATURE INDEPENDENT, DYNAMICALLY COMPRESSED VOLTAGE FUNCTION OF THE VALUE OF AN EXTERNAL REGULATION RESISTANCE

DESCRIPTION

1. Technical Field

The present invention relates to an integrated circuit for generating a temperature independent, dynamically compressed voltage as a function of the value of a regulation external resistance. The present invention is particularly useful as an improved "tuner delay" circuit of an AGC system for a TV receiver and the like.

2. Background of the Invention

In integrated systems it is often necessary to generate a certain control signal, function of the difference between a DC voltage signal, e.g. representative of the amplitude of a converted intermediate frequency signal of a superetherodyne receiver, and a control voltage which may be adjusted by means of an external potentiometer. However, when such a control voltage is obtained by forcing a constant current through an external potentiometer, according to a common practice, a 1:1 ratio of variation of the so generated control voltage across the terminal of the potentiometer is obtained. If a relatively low biasing current is used, for small values of the external resistance, excessively small variations of the control voltage are obtained across the external resistance while if a relatively large biasing current is used, for large values of resistance of the potentiometer, proportionally large variations of the control voltage are obtained in comparison with the variations generated when the resistance value of the external potentiometer is close to zero. In other words, such a control voltage generating setup has an excessive dynamics and the latter should advantageously be compressed.

OBJECTIVES AND SUMMARY OF THE INVENTION

A main objective of the present invention is to provide an integrated circuit capable of generating a temperature insensitive voltage, dynamically compressed, as a function of the value of a variable resistance external to the integrated circuit.

It is another objective of the invention to provide an improved "tuner delay" circuit for the AGC system of a receiver.

These objectives and related advantages are achieved by means of the integrated circuit of the present invention.

Basically the circuit of the invention employs an essentially temperature independent constant current generator for forcing a current through a potentiometer or variable resistor external to the integrated circuit. Any voltage variation across the external potentiometer is first converted by means of a circuit employing a current mirror into a current which is forced through an integrated resistance so as to maintain across the latter a voltage substantially identical to the voltage present across the external potentiometer. This current which is forced through the integrated resistance is further converted into a voltage in accordance with a linear-logarithmic, current-to-voltage conversion law. The voltage of the current mirror's node on the input branch of the converter circuit, is applied to the input of a unitary gain stage which is biased by means of a current generator having a temperature coefficient which is inversely proportional to the temperature coefficient of integrated resistances. The output voltage of the unitary gain stage is compared by means of a differential stage which is also biased by means of a second current generator having a temperature coefficient inversely proportional to the temperature coefficient of integrated resistances. The voltage resulting from the conversion of said current forced through the integrated resistance connected in the output branch of the converter circuit. The differential stage is provided with an integrated resistance load and produces on an output terminal a voltage which is a desired dynamically compressed function of the voltage across the external potentiometer and substantially independent of temperature variations. The compression of the dynamics of the output voltage may be determined according to necessity by suitably choosing the values of the integrated resistances and of the currents generated by said bias current generators.

Independence from temperature is determined by the use of a temperature insensitive constant current generator for forcing the current through the external adjustable resistance or potentiometer and by the use of said two integrated bias generators purposely having a temperature coefficient which is essentially the reciprocal of the temperature coefficient of the two integrated resistances employed by the circuit. The transfer function of the circuit does in fact exhibit product terms between said two bias currents and said two integrated resistances so that the respective temperature coefficients counterbalance each other. Of course, substantial independence from temperature requires that the supply voltage of the circuit be temperature independent too and that the current generated by said constant current generator forcing a current across the external variable resistance or regulation potentiometer as well as the latter be substantially insensitive to temperature variations.

According to a particular application embodiment of the present invention, such a compressed-dynamics, temperature independent, control voltage is used for generating a control current independent of temperature and function of the difference between said control voltage and a voltage signal (e.g. proportional to the amplitude of a converted, intermediate frequency signal of a superetherodyne receiver) by applying the two signals respectively to two input terminals of a differential stage biased by means of a substantially temperature independent constant current generator and by employing the differential output signal of said differential stage for driving an output current gain stage for generating the desired control DC current, the value of which is substantially independent of the temperature.

BRIEF DESCRIPTION OF THE DRAWINGS

The different aspects and advantages of the present invention will become evident through the following detailed description of a practical embodiment, shown for purely illustrative and nonlimitative purposes in the appended drawings, wherein.

DESCRIPTION OF PREFERRED EMBODIMENTS

Figure 1:
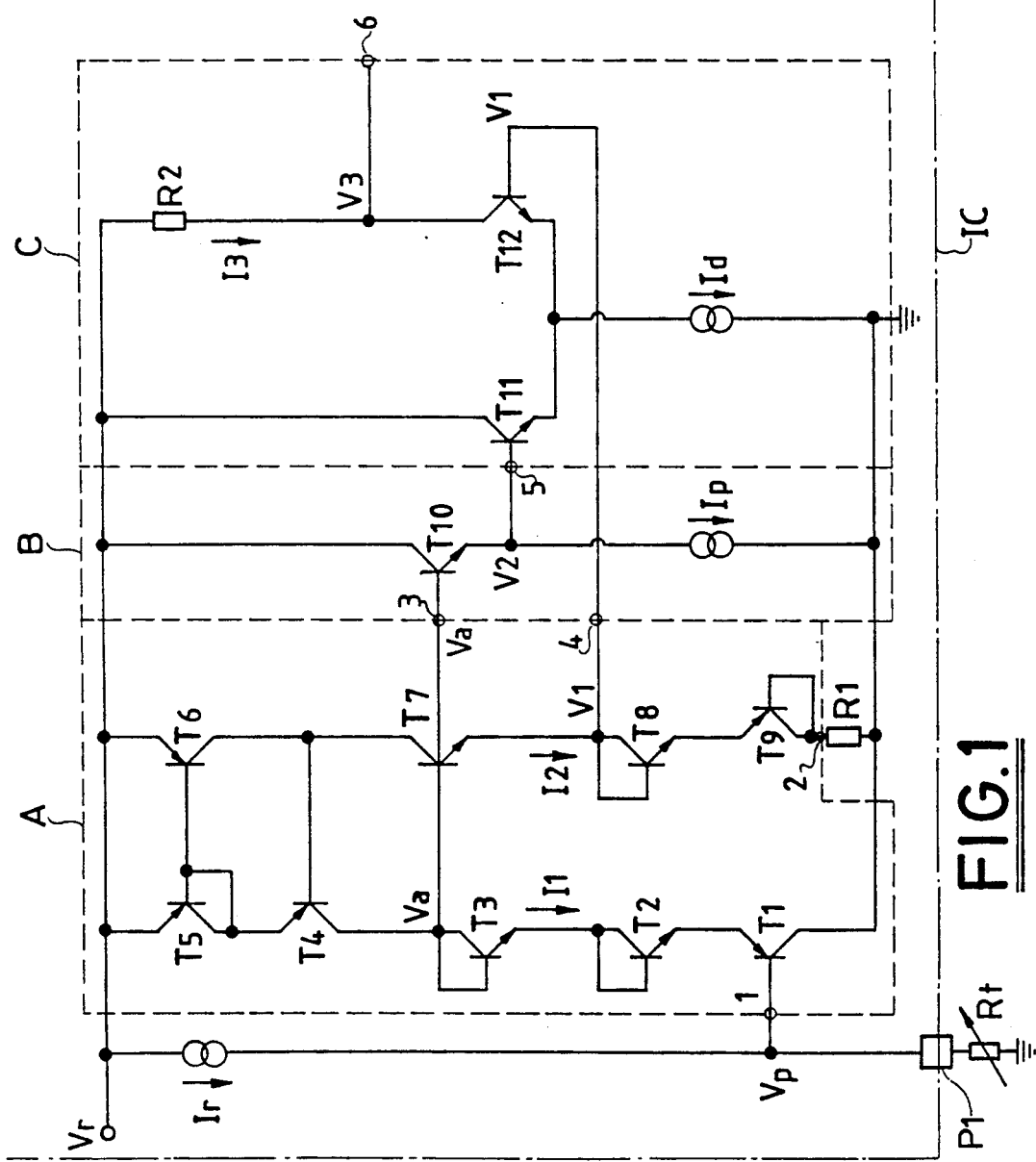
FIG. 1 is the diagram of a circuit made in accordance with the present invention.

FIG. 1 is a illustration of a portion of a generic integrated circuit, IC, containing the circuit of the present invention, the diagram of which is shown. A variable resistance (potentiometer) Rt is connected between a pin P1 of the integrated device and ground. A constant current Ir generated by a temperature independent constant current generator supplied by a temperature independent voltage Vr is forced through the external control resistance Rt.

The voltage Vp across the external control resistance Rt is applied to an input terminal 1 of a linear-logarithmic, voltage-to-current converter, which is depicted inside the dash-line perimeter A of FIG. 1. The function performed by this converter circuit is firstly that of converting a linear variation of the voltage across the external resistance Rt into a linear variation of a current I2 which is forced, through the current output terminal 2, across an integrated resistance R1, which is connected between the terminal 2 and ground, in order to maintain across this integrated resistance R1 a voltage substantially identical to the voltage Vp which is present across the external control resistance Rt. This converter circuit is formed by the transistors T1 to T9. Essentially the voltage Vp which is applied to the base of the PNP transistor T1 of the input branch of the converter circuit, determines a certain current I1 flowing through the input branch of the circuit which is mirrored as a current I2 on the output branch of the circuit by a current mirror formed by the transistors T5, T6 and T4. The two diode-connected transistors T2 and T8 are only for adding a VBE (base-emitter voltage) term to the two differential voltage levels Va and V1, respectively of the input branch and of the output branch of the converter circuit A. Of course the presence of these two transistors T2 and T8 is not strictly necessary or more than two diode-connected transistors may be used in both branches of the circuit. The equilibrium condition of the currents I1 and I2 in the two branches of the converter circuit A imposed by the current mirror (T4, T5 and T6) reflects itself in a certain differential voltage signal procured by the transistor T7 which acts as a current-to-voltage converting element in accordance with a linear-logarithmic conversion law. Basically, on the two differential voltage output terminals 3 and 4 of the converter circuit, a differential voltage signal will be present, the level of which will be a logarithmic function of the voltage Vp, applied to the input terminal 1 of the converter circuit.

The voltage Va is applied to the input of a unitary gain stage which is depicted within the dash-line perimeter B and which is formed by the transistor T10 biased by a constant current generator It which deliberately has a temperature coefficient equal to the reciprocal of the temperature coefficient of integrated resistances. The output voltage V2 is applied to a first input terminal of a differential amplifier, depicted inside the dash-line perimeter C of FIG. 1 and which is formed by the diffential pair of transistors T11 and T12, the integrated load resistance R2 and the bias current generator Id, which also deliberately has a temperature coefficient equivalent to the reciprocal of the temperature coefficient of integrated resistances. To the other input terminal 4 of the differential stage is applied the voltage V1 and the desired output voltage V3 which is substantially independent of temperature and is a dynamically compressed function of the voltage Vp is generated on the output terminal 6.

ANALYSIS OF THE OPERATION OF THE CIRCUIT

Independently of the value of the external control resistance Rt the following equations hold:

$$Vp = IrRt$$

$$Va = Vp + 3VBE = IrRt + 3Vt \ln \frac{I1}{Is}$$

where $$Vt = \frac{KT}{q}$$

and Is is the reverse saturation current of the transistors used in the circuit; however the current mirror formed T4, T5 and T6, ensures that I1=I2 and furthermore:

$$I2 = \frac{Vp + 3VBE - 3VBE}{R1} = \frac{Vp}{R1} = Ir\frac{Rt}{R1};$$

therefore $$Va = IrRt + 3Vt \ln \left( \frac{Ir}{Is} \frac{Rt}{R1} \right);$$

$$V2 = Va - Vt \ln \left( \frac{Ip}{Is} \right)$$

$$V1 = Va - Vt \ln \left( \frac{I2}{Is} \right) = Va - Vt \ln \left( \frac{Ir}{Is} \frac{Rt}{R1} \right)$$

$$\Delta V = V2 - V1 = Vt \ln \left( \frac{Ir}{Ip} \frac{Rt}{R1} \right).$$

Moreover it is demonstrated that if $\Delta V$ is applied to the differential formed by T11 and T12, the current I3 is given by:

$$I3 = Id \frac{1}{1 + \exp\left( \frac{\Delta V}{Vt} \right)}$$

from which:

$$V3 = Vr - R2I3 = Vr - R2Id \frac{1}{1 + \frac{IrRt}{R1Ip}}. \quad (1)$$

As easily observed from the expression (1), given that the constant current generator Ir, the supply voltage Vr and the external control resistance Rt have a substantially null temperature coefficient, i.e. are all practically insensitive to temperature variations, the two product terms R2Id and R1Ip contained in the equation (1), are themselves substantially independent of temperature, because the generators Id and Ip have a temperature coefficient equal to the reciprocal of the temperature coefficient of the integrated resistances R1 and R2, so that the value of the voltage V3 generated by the circuit will be independent of temperature as desired.

Moreover, the voltage V3 produced by the circuit is no longer linearly proportional to the voltage Vp=IrRt, but it is a dynamically compressed function of the latter. The desired compression is obtained by suitably choosing the values of R1, R2, Ir, Id and Ip, thus achieving also the second objective of the invention.

Figure 2:
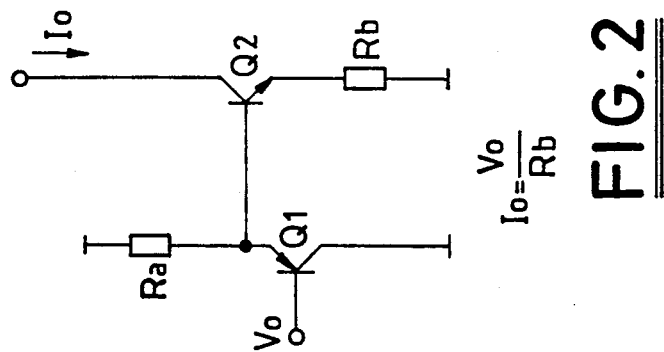
FIG. 2 is a circuit diagram of a generic integrated constant current generator having a temperature coefficient equivalent to the reciprocal of the temperature coefficient of integrated resistances.

A constant current generator with a temperature coefficient equivalent to the reciprocal of the temperature coefficient of integrated resistances, may be easily made. A practical example of such an integrated current generating circuit is depicted in FIG. 2. The circuit is formed by two transistors Q1 and Q2 and by two integrated resistances Ra and Rb. For a certain constant voltage Vo (essentially temperature independent) applied to the base of Q1, a current Io=Vo/Rb is generated.

Numerous constant voltage generators independent of temperature are described in literature as well as temperature independent constant current generators, as it is well known to the skilled technician. Therefore a reiterated description of such commonly known circuits is deemed superfluous. The book entitled "Analysis and Design of Analog Integrated Circuits" by P. R. Gray - R. G. Meyer, J. Wiley and Sons. Publishers, on pages 248-259, contains a description of several of such temperature independent voltage and current generators, the description of which is herein incorporated by express reference.

Figure 3:
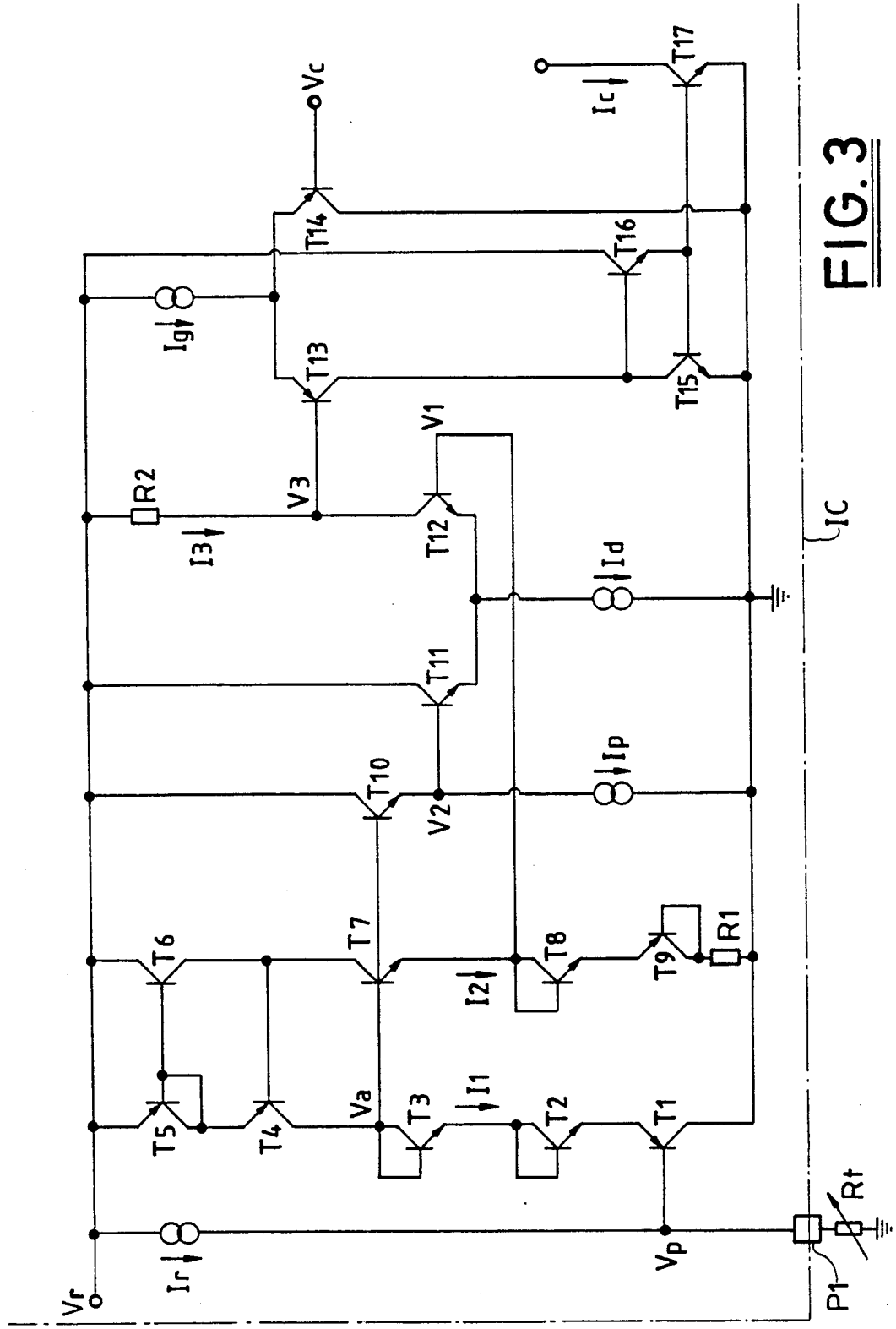
FIG. 3 shows an application of the circuit of FIG. 1 for generating a control current signal function of the difference between a temperature stable contol voltage generated by the circuit of FIG. 1 and a second voltage signal.

A significantly useful embodiment of the circuit of FIG. 1 for generating a control current substantially independent of temperature and which is function of the difference between a temperature independent control voltage generated by the circuit of the invention of FIG. 1 and a generic voltage signal Vc, which may be representative of the amplitude of the intermediate frequency signal of a superetherodyne receiver in order to implement by the generation of said control current Ic an automatic gain control of the tuner of the receiver is depicted in FIG. 3.

As observed in FIG. 3, the control voltage signal V3, which is independent of temperature and has a compressed dynamics in respect to the voltage Vp across the regulating potentiometer Rt, is fed to an input terminal of a differential stage formed by the pair of transistors T13 and T14 and which is biased by an essentially temperature independent constant current generator Ig. To the other input terminal of the differential stage the voltage signal Vc is fed. The differential stage is completed by a load formed by the pair of transistors T15 and T16 and the output signal produced by the differential stage is fed to the base of the transistor T17 which constitutes an output current gain stage in order to generate a DC control current Ic which will be substantially independent from temperature variations when the voltage signals V3 and Vc equal each other.

What we claim is:

1. An integrated circuit for generating a temperature independent and dynamically compressed voltage as a function of the value of a control resistance (Rt) external to the integrated circuit which is connected between a pin of the integrated circuit and a common ground which comprises a temperature independent constant current (Ir) generator connected between a supply rail and said pin to which said external resistance (Rt) is connected;

a current mirror converter circuit having a voltage input terminal on a first branch of the circuit connected to said pin and a current output terminal on a second branch of the circuit connected to a terminal of a first integrated resistance (R1), the other terminal of which is connected to ground, said converter circuit being capable of converting by means of a current mirror a linear variation of the voltage present across said external control resistance (Rt) in a linear variation of a current, which is forced through said current output terminal across said first integrated resistance (R1) for maintaining across the terminal of said integrated resistance a voltage substantially identical to the voltage present across said external control resistance, said current imposed by said current mirror through said first integrated resistance (R1) being converted by means of a transistor (T7) of said second branch of the converter circuit, carrying said current, into a first voltage (V1) developed on a first differential voltage output terminal in accordance with a linear-logarithmic conversion law the level of which is a logarithmic function of the linear variation of the voltage (Vp) across said external control resistance (Rt), for producing a differential voltage signal between the voltage of said first differential voltage output terminal (V1) and of a second differential voltage output terminal (Va), respectively on said second and on said first branch of said current mirror converter circuit;

a unitary gain stage having an input terminal connected to said second differential voltage output terminal (Va) of said first branch of the converter circuit and an output terminal, said unitary gain stage being biased by means of a first integrated constant current (Ip) generator having a temperature coefficient substantially equal to the reciprocal of the temperature coefficient of integrated resistances of said first integrated resistance and an integrated load resistance (R2);

a differential stage biased by means of a second integrated constant current (Id) generator having a temperature coefficient substantially equal to the reciprocal of the temperature coefficient of integrated resistances of said first integrated resistance and an integrated load resistance (R2) and having a first input terminal connected to the output terminal of said unitary gain stage and a second input terminal connected to said first differential voltage output terminal of the second branch of said converter circuit and an output terminal, said integrated load resistance (R2) being connected between said output terminal of the differential stage and the supply rail and being traversed by a current (I3);

the circuit generating a voltage (V3) on said output terminal of said differential stage the value of which is given by the following relation:

$$V3 = Vr - R2I3 = Vr - R2Id \frac{1}{1 + \frac{IrRt}{R1Ip}}$$

where Vr is a substantially temperature independent supply voltage, the generated voltage (V3)

being independent of temperature because of the counteracting of the respective temperature coefficients in the two product terms: R2Id and R1Ip, of said relation between an integrated resistance and a current generator having a temperature coefficient corresponding to the reciprocal of the temperature coefficient of integrated resistances, and having a dynamically compressed ratio in respect to the variations of the voltage across said external control resistance (Rt) which is determined by the choice of the relative values of R1, R2, Ir, Id and Ip.

2. The circuit according to claim 1, wherein the first branch of said converter circuit comprises a first transistor (T1) of a first polarity having a collector connected to said common ground node of the circuit, a base connected to said external pin and an emitter connected to an emitter of at least a second, diode-connected transistor (T3) of a second polarity and having a collector connected to a first branch of the current mirror and constituting said second differential voltage output terminal of the converter circuit and wherein the second branch of said converter circuit comprises a third diode-connected transistor (T9) of said first polarity having a collector which constitutes said output current terminal connected to said first integrated resistance (R1) and an emitter which is connected to the emitter of at least a fourth transistor (T7) of said second polarity having a base connected to said second differential voltage output terminal of the converter circuit and a collector connected to the second branch of said current mirror;

said first differential voltage output terminal of the converter circuit coinciding with the emitter node of said fourth transistor (T7).

3. The circuit according to claim 2, wherein at least one or more diode (T2 and T8) are connected respectively between the emitters of said first and said second transistors (T1 and T3) and between the emitters of said third and said fourth transistors (T9 and T7).

4. The circuit according to claim 2, wherein said current mirror has on said first branch thereof an additional transistor (T4) having a collector connected to said second differential voltage output terminal, an emitter connected to the collector of a diode-connected transistor (T5) of the first branch of the current mirror and a base connected to the collector of the transistor (T6) of the second branch of the current mirror.

5. An integrated circuit for generating a gain control DC current (Ic) for the tuner of a superetherodyne receiver in function of the difference between a control voltage and a voltage signal (Vc) proportional to the amplitude of the intermediate frequency signal of the receiver and wherein said generated current (Ic) is substantially independent from temperature variations and said control voltage is a dynamically compressed function of the value of a control resistance external to the integrated circuit, characterized by the fact that the circuit comprises the integrated circuit of claim 1, for generating said temperature independent, dynamically compressed control voltage;

a differential stage biased by means of temperature independent, constant current (Ig) generator and having a first input terminal to which said control voltage (V3) generated by said circuit of claim 1 is fed, a second input terminal to which said voltage signal (Vc) proportional to the amplitude of the intermediate frequency signal of the receiver is fed and an output terminal on which an output voltage signal proportional to said difference is produced;

said output signal produced by said differential stage being substantially independent from temperature variations and driving an output current gain stage for generating said control current (Ic).

6. An integrated circuit for generating a temperature independent and dynamically compressed voltage as a function of the value of a control resistance (Rt), external to the integrated circuit and which is connected between a pin of the integrated circuit and a common ground, which comprises a temperature independent constant current generator (Ir) connected between a supply rail and said pin to which said external resistance (Rt) is connected;

a converting circuit which utilizes a current mirror for forcing a current through a first integrated resistance (R1), capable of converting a variation of a voltage present across said external control resistance (Rt) into a dynamically compressed differential voltage signal across a first differential voltage output terminal (V1) and a second differential voltage output terminal (Va), in accordance with a linear-to-logarithmic conversion law;

a unitary gain stage, biased by means of a first integrated constant current (Ip) generator having a temperature coefficient substantially equal to the reciprocal of the temperature coefficient of an integrated resistance of said first integrated resistance (R1) and an integrated load resistance (R2) and having an input terminal connected to said second differential voltage output terminal (Va) of said converting circuit and an output terminal;

a differential stage, biased by means of a second integrated constant current (Id) generator having a temperature coefficient substantially equal to the reciprocal of said temperature coefficient of an integrated resistance, and having a first input terminal connected to the output terminal of said unitary gain stage and a second input terminal connected to said first differential voltage output terminal of said converting circuit and an output terminal, an integrated load resistance (R2) being connected between said output terminal of the differential stage and the supply rail and being traversed by a current (I3);

the circuit generating a voltage (V3) on said output terminal of said differential stage the value of which is given by the following relation:

$$V3 = Vr - R2I3 = Vr - R2Id \frac{1}{1 + \frac{IrRt}{R1Ip}}$$

where Vr is a substantially temperature independent supply voltage, the generated voltage (V3) being independent of temperature because of the counteracting of the respective temperature coefficients in the two product terms: R2Id and R1Ip, of said relation between an integrated resistance and a current generator having a temperature coefficient corresponding to the reciprocal of the temperature coefficient of an integrated resistance, and having a dynamically compressed ratio in respect to the variations of the voltage across said external control resistance (Rt) which is determined by the choice of the relative values of R1, R2, Ir, Id and Ip.

7. An integrated circuit for generating a gain control DC current (Ic) for the tuner of a superetherodyne receiver in function of the difference between a control voltage and a voltage signal (Vc) proportional to the amplitude of the intermediate frequency signal of the receiver and wherein said generated current (Ic) is substantially independent from temperature variations and said control voltage is a dynamically compressed function of the value of a control resistance external to the integrated circuit, characterized by the fact that the circuit comprises the integrated circuit of claim 6, for generating said temperature independent, dynamically compressed control voltage;

a differential stage biased by means of temperature independent, constant current (Ig) generator and having a first input terminal to which said control voltage (V3) generated by said circuit of claim 6 is fed, a second input terminal to which said voltage signal (Vc) proportional to the amplitude of the intermediate frequency signal of the receiver is fed and an output terminal on which an output voltage signal proportional to said difference is produced;

said output signal produced by said differential stage being substantially independent from temperature variations and driving an output current gain stage for generating said control current (Ic).

* * * * *